US012627303B1

(12) United States Patent
Lin

(10) Patent No.: US 12,627,303 B1
(45) Date of Patent: May 12, 2026

(54) SYNCHRONOUS TIME-TO-CHARGE CONVERTER

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 22 days.

(21) Appl. No.: 18/941,104

(22) Filed: Nov. 8, 2024

(51) Int. Cl.
| | |
|---|---|
| *H03L 7/06* | (2006.01) |
| *G06F 1/04* | (2006.01) |
| *H03L 7/089* | (2006.01) |

(52) U.S. Cl.
CPC ............... *H03L 7/089* (2013.01); *G06F 1/04* (2013.01)

(58) Field of Classification Search
CPC ... H03L 7/06; H03L 7/08; H03L 7/081; H03L 7/085; H03L 7/089; H03L 7/0891; G06F 1/04; G06F 1/06; G06F 1/08; G06F 1/10; H02M 3/07; H02M 3/073
See application file for complete search history.

(56) References Cited

U.S. PATENT DOCUMENTS

| | | | |
|---|---|---|---|
| 7,629,854 B2 | 12/2009 | Lin | |
| 12,126,342 B1 * | 10/2024 | Lin | ........................ H03K 3/023 |

* cited by examiner

*Primary Examiner* — Long Nguyen
(74) *Attorney, Agent, or Firm* — McClure, Qualey & Rodack, LLP

(57) ABSTRACT

A time-to-charge converter (TCC) includes a phase detector configured to receive a first clock and a second clock and output a phase error signal indicative of the time difference between the second clock and the first clock; a current source configured to generate a tail current; a current directing network configured to direct the tail current towards either a first node or a second node based on the phase error signal; a synchronous clock generator configured to receive the first clock and generate a third clock that is synchronous to the first clock but has an independently determined duty cycle; an integration capacitor having a top plate connected to the second node and a bottom plate driven by an inversion of the third clock; a switch positioned between a third node and the second node, controlled by the third clock; and a load capacitor attached to the third node.

9 Claims, 4 Drawing Sheets

UP and DN Jointly embody a phase error signal representing a time difference between CK1 and CK2

Charge transferred to node 101 of amount proportional to the phase error signal

SYNCHRONOUS TIME-TO-CHARGE CONVERTER

BACKGROUND OF THE INVENTION

Field of the Invention

The present invention generally relates to time-to-charge converter (TCC) and particularly to TCCs that are synchronous with a reference clock.

Description of Related Art

Those skilled in the art will understand and recognize the terms and fundamental concepts employed herein related to microelectronics, such as "voltage," "current," "signal," "logical signal," "clock," "phase," "(clock) edge," "duty cycle," "capacitor," "transistor," "node," "ground node," "power supply node," "inverter," "switch," "common-gate amplifier," "load," "flip-flop," "noise," and "impedance." The aforementioned terms and concepts, as utilized in the present disclosure, are readily comprehensible to those skilled in the art and thus do not require extensive elaboration.

A MOSFET (Metal-Oxide-Semiconductor Field-Effect Transistor), hereinafter referred to as "MOS transistor" or "MOST," is an active device comprising source, gate, and drain terminals, and is capable of operating as an amplifier or a switch. The MOST includes NMOS (n-channel) and PMOS (p-channel) transistors. The MOST remains in an off state and exhibits characteristics akin to an open circuit when the gate-to-source voltage is below a specified threshold voltage. The MOST enters an on state when the gate-to-source voltage surpasses the threshold voltage; in this scenario, it functions within the "saturation region" and operates effectively as an amplifier if the gate-to-drain voltage is below the threshold voltage. Conversely, it operates within the "linear region" and functions as a switch when the gate-to-drain voltage exceeds the threshold voltage. Those skilled in the art will recognize the symbols for a MOST, for both PMOS and NMOS transistors, and can identify a "source" terminal, a "gate" terminal, and a "drain" terminal of a MOST. For brevity, in the present disclosure, in the context of reference to a MOST, a "source terminal" is referred to as "source," a "gate terminal" is referred to as "gate," and a "drain terminal" is referred to as "drain."

Those skilled in the art will readily comprehend the connection between resistors, capacitors, MOS transistors, inverters, switches, and other components as depicted in circuit schematics. Therefore, a detailed description delineating the interconnections among these components is deemed unnecessary.

A signal is either a voltage or current of a variable level that carries certain information and can vary with time. The level of the signal at a moment represents the state of the signal at that moment. A signal is a "voltage signal" ("current signal") if it is a voltage (current). In this present disclosure, since "voltage signals" appear more often than "current signals," for brevity a "signal" refers to a "voltage signal" unless it is otherwise specified as a "current signal."

A logical signal comprises two distinct states: low (0) and high (1). The expression "Q is high (1)" denotes that Q is in its high (1) state, whereas "Q is low (0)" indicates that Q is in its low (0) state. A logical signal can be utilized to either enable or disable a function; the state that effectuates the enablement of the function is herein referred to as the "on state."

Upon the transition of a logical signal from a low state (0) to a high state (1), or from a high state (1) to a low state (0), the occurrence of a rising edge or a falling edge is respectively observed. A pulse of the logical signal is thereby defined, commencing at the rising edge and concluding at the subsequent falling.

A clock is a logical signal that cyclically toggles back and forth between 0 and 1. A duty cycle of a clock is a percentage of time that the clock remains 1.

A time of a clock refers to a time instant at which a rising edge of the clock occurs. A time difference between a first clock and a second clock refers to the amount of separation between a time instant at which a rising edge of the first clock occurs and a time instant at which a rising edge of the second clock occurs. In the present disclosure, the terms "time" and "timing" as they pertain to a clock are synonymous and interchangeable, both referring to the time instant at which a rising edge occurs.

In numerous applications, a time-to-charge converter is needed, wherein a time difference between a first clock and a second clock is detected and then converted into an electrical charge (hereafter charge for brevity) of amount proportional to the time difference. As shown in FIG. 1, a TCC (time-to-charge converter) 100 comprises: a PD (phase detector) 110 that detects a time difference between a first clock CK1 and a second clock CK2 and delivers a phase error signal that is jointly embodied by two logical signals UP and DN to represent the time difference; and a CP (charge pump) 120 that converts the phase error signal into a charge transferred to an output node 101, which is terminated with a load 130 that comprises a shunt capacitor 131 in parallel with a serial connection of a serial resistor 132 and a serial capacitor 133. When a time of CK2 leads a time of CK1, a pulse of DN of a width proportional to the time difference between CK2 and CK1, is generated; otherwise, a pulse of UP is generated.

In a particular application of interest where TCC 100 is used in a fractional-N PLL (phase lock loop), CK1 is a reference clock that has a stable periodic timing from cycle to cycle, CK2 is a feedback clock that is divided down from an output clock (of the fractional-N PLL locked to the reference clock) with a divisor that is dithered based on a DSM (delta-sigma modulation) and has a timing that varies from cycle to cycle but always leads the timing of CK1. As a result, DN pulses of varying widths are generated at varying instants (relative to the timing of the reference clock). Even though TCC 100 can deliver a charge (to node 101) of amount accurately proportional to the time difference between CK1 and CK2, the instant that the charge transfer takes place varies from cycle to cycle. In other words, the charge transfer is asynchronous to the reference clock. The DSM is supposed to dither the amount but not the timing of the charge transfer. The dependence of the timing of the charge transfer on the DSM induces an additional DSM dependent noise to the PLL and degrades the performance.

In U.S. Pat. No. 7,629,854, Lin et al. discloses a method that relies on a switch-capacitor circuit to perform the charge transfer synchronously with the reference clock, thus eliminating the additional DSM dependent noise. The method disclosed thereof, however, needs an operational amplifier for the charge transfer. The operational amplifier is subject to instability and usually consumes appreciable power and adds circuit noises to the PLL.

What is desired is a synchronous time-to-charge converter that doesn't need an operational amplifier but can still perform accurate charge transfer.

3

BRIEF SUMMARY OF THIS INVENTION

An objective of the present invention is to execute time-to-charge conversion of a time difference between a second clock and a first clock using a two-phase scheme that is synchronous with the first clock but exhibits an independently determined duty cycle, wherein the first clock maintains a stable periodic timing.

In one embodiment, a time-to-charge converter (TCC) comprises: a phase detector configured to receive a first clock and a second clock and output a phase error signal indicative of the time difference between the second clock and the first clock; a current source configured to generate a tail current; a current directing network configured to direct the tail current towards either a first node or a second node based on the phase error signal; a synchronous clock generator configured to receive the first clock and generate a third clock that is synchronous to the first clock but has an independently determined duty cycle; an integration capacitor having a top plate connected to the second node and a bottom plate driven by an inversion of the third clock; a switch positioned between a third node and the second node, controlled by the third clock; and a load capacitor attached to the third node. This configuration allows the time-to-charge conversion to be executed synchronously with the first clock, thus eliminating the dependency on a delta-sigma modulator (DSM) and reducing DSM-induced noise when it is used in a fractional-N phase lock loop. Additionally, it enables accurate charge transfer without the need for an operational amplifier, avoiding instability thereof and reducing power consumption.

DETAILED DESCRIPTION OF THIS INVENTION

The present invention relates to time-to-charge converters. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

A circuit is a collection of a transistor, a capacitor, an inductor, a resistor, and/or other electronic devices interconnected in a certain manner to embody a certain function. A network is a circuit or a collection of circuits configured to embody a certain function.

In this present disclosure, a "circuit node" is simply referred to as a "node" for short, as the meaning is clear from a context of microelectronics and won't cause confusion.

A switch operates based on a logical signal, acting as a short circuit when the signal is 1 and an open circuit when it's 0.

Through this disclosure, "V_DD" denotes a power supply node.

Figure 1:
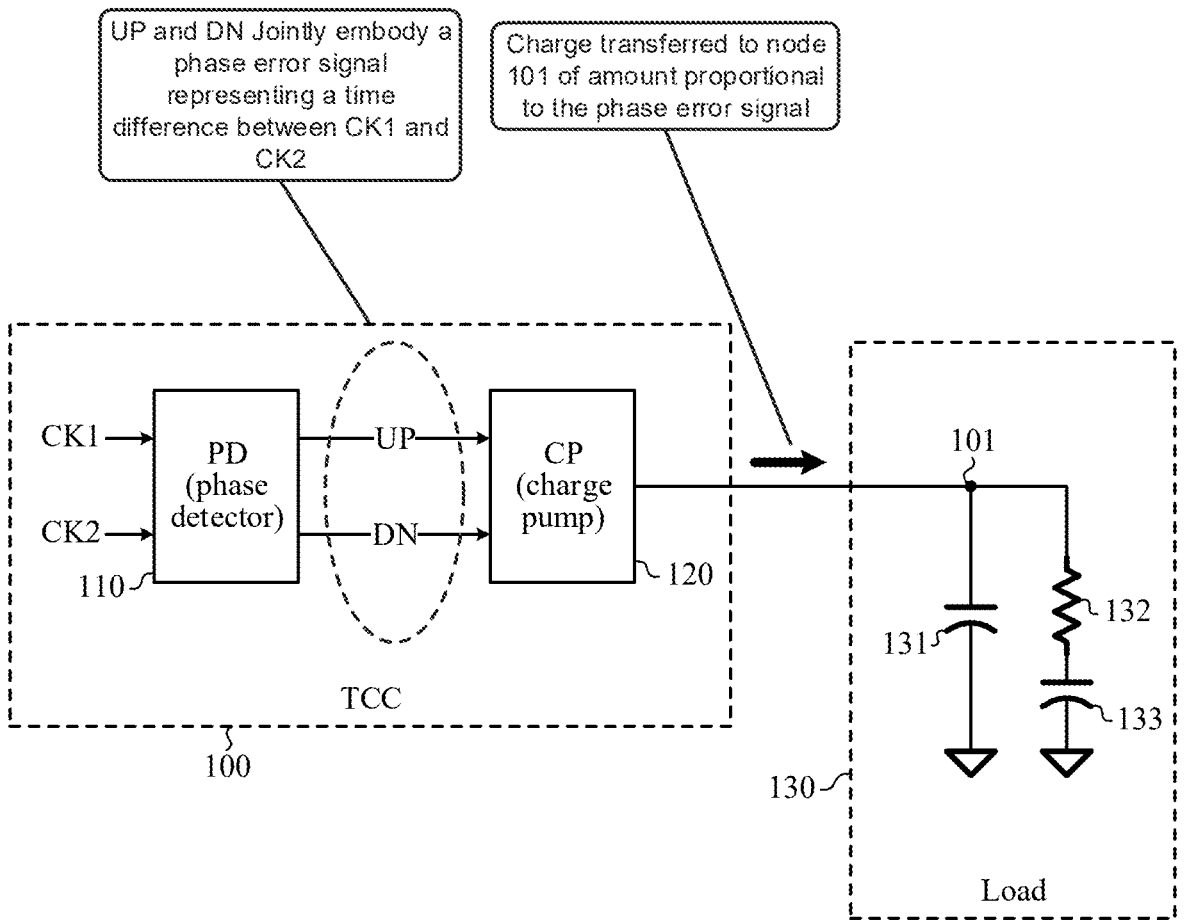
FIG. 1 shows a functional block diagram of a time-to-charge converter.
Figure 2:
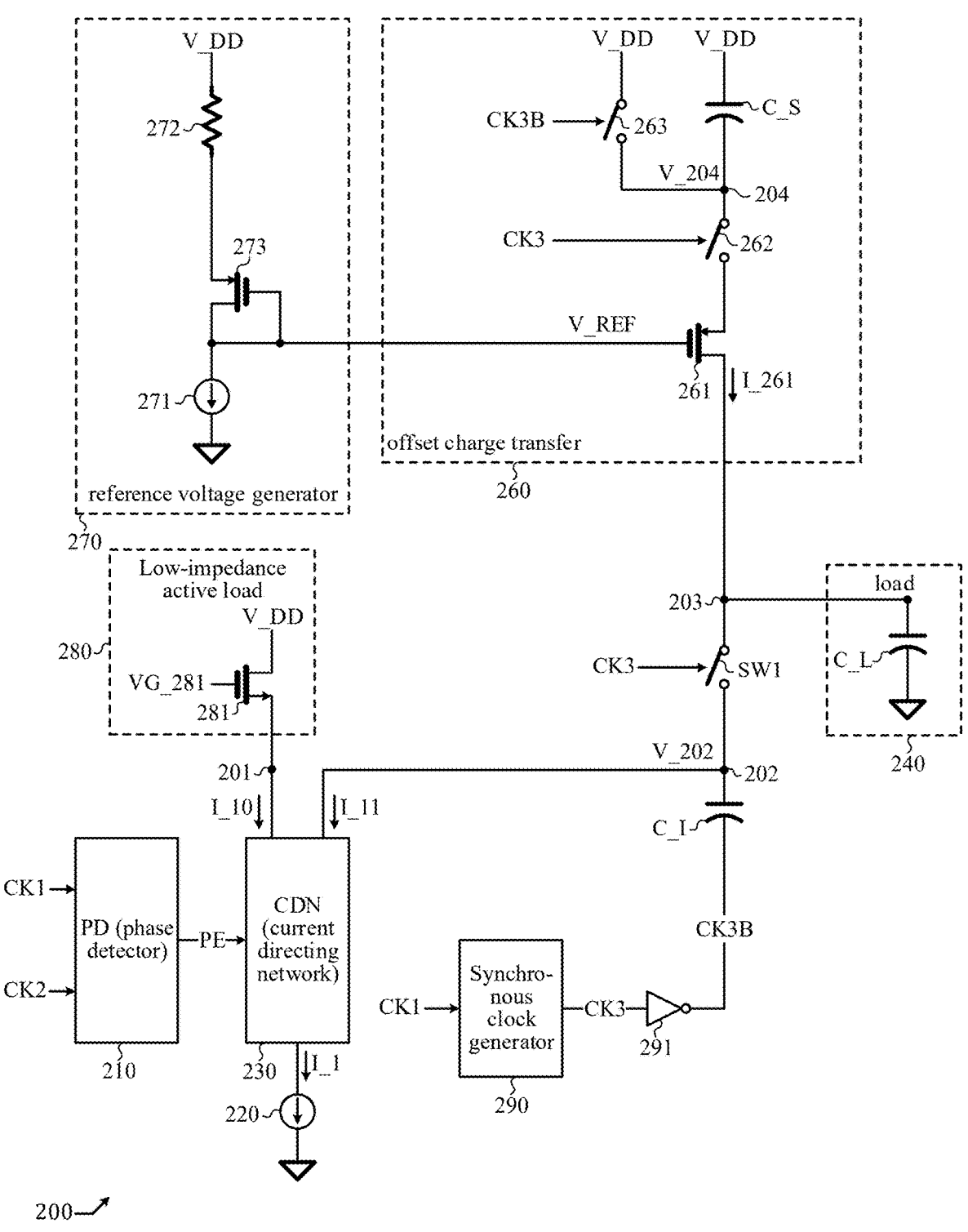
FIG. 2 shows a functional block diagram of a time-to-charge converter in accordance with an embodiment of the present invention.

A schematic diagram of a time-to-charge converter (TCC) 200 in accordance with an embodiment of the present invention is depicted in FIG. 2. The TCC 200 comprises: a phase detector (PD) 210 configured to receive a first clock CK1 and a second clock CK2 and output a phase error signal PE, wherein said phase error signal PE exhibits a rising edge in response to a rising edge of CK2 and a falling edge in response to a rising edge of CK1; a current source 220 configured to establish a tail current I_1; a current directing network (CDN) 230 configured to steer said tail current either into a first branch I_10 directed toward a first node 201 or a second branch I_11 directed toward a second node 202 in accordance with said phase error signal PE; a synchronous clock generator 290 configured to receive the first clock and output a third clock CK3 that is synchronous to the first clock, where a rising edge of CK1 triggers a rising edge of CK3, but has an independently determined duty cycle; an integration capacitor C_I having a top plate attached to said second node 202 and a bottom plate driven by an inverted clock CK3B, which is an inversion of the third clock CK3 established by using an inverter 291; and a first switch SW1 controlled by the third clock CK3 and inserted between a third node 203 and said second node 202. Said third node 203 is attached to a load 240 comprising a load capacitor C_L.

The TCC 200 is configured for use in an application wherein CK1 serves as a reference clock characterized by stable periodic timing and generated by, for instance, a crystal oscillator, whereas CK2 constitutes a derived clock potentially prone to jittery timing. The objective of the TCC 200 is to transfer a charge to the load 240 in an amount directly proportional to the time difference between CK1 and CK2.

The PD 210 is configured to perform phase detection and output the phase error signal PE, which is a pulse indicative of the time difference between the second clock CK2 and the first clock CK1. In one embodiment, the rising edge of CK2 always precedes the rising edge of CK1. The PD 210 may be embodied by a phase/frequency detector (PFD), which is well known in the relevant art and therefore not described in detail herein.

Figure 3:
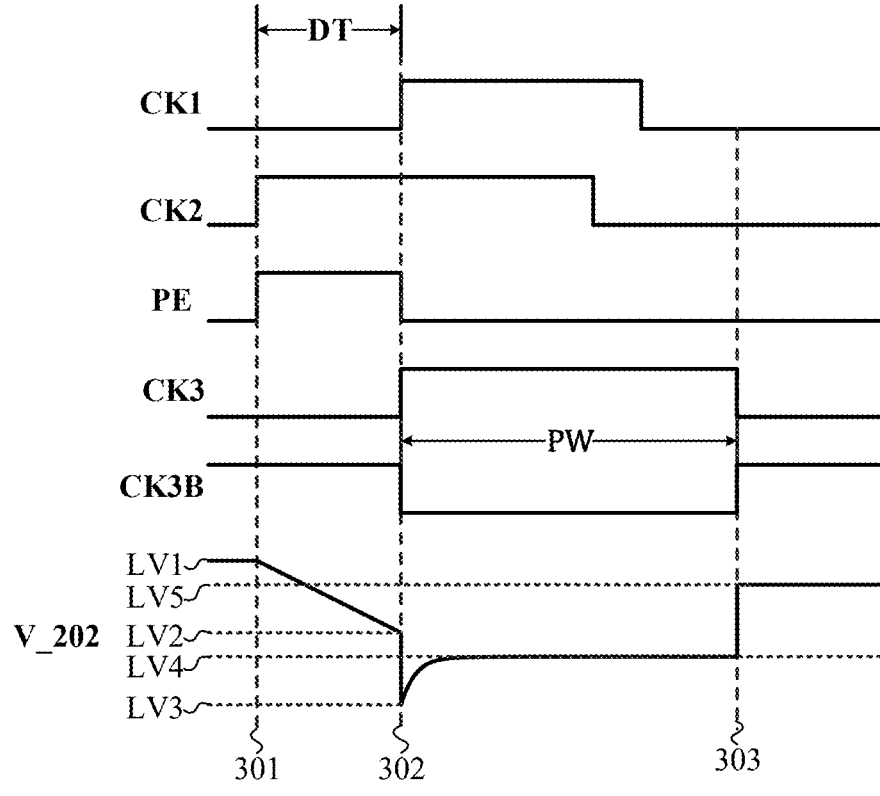
FIG. 3 shows an exemplary timing diagram of the time-to-charge converter of FIG. 2.

An exemplary timing diagram of the TCC 200 is depicted in FIG. 3. CK2 exhibits a rising edge at a first time instant 301. CK1 exhibits a rising edge at a second time instant 302. PE exhibits a rising edge at the first time instant 301 and a falling edge at the second time instant 302, so that a pulse width of PE, denoted by DT in FIG. 3, corresponds to the time difference between the first time instant 301 and the second time instant 302, thereby representing the time difference between CK2 and CK1. CK3 is synchronous to CK1 and exhibits a rising edge at the second time instant 302 and a falling edge at a third time instant 303, and has a wider pulse width, denoted by PW, than CK1. In other words, CK3 is synchronous to CK1 but has a larger duty cycle. CK3B is an inversion of CK3 and thus exhibits a falling edge at the second time instant 302 and a rising edge at the third time instant 303, wherein a difference between the second time instant 302 and the third time instant 303 is equal to PW. Initially, CK1, CK2, CK3, and PE are all low and CK3B is high; as a result, SW1 is turned off, I_1 is directed to I_10, I_11 is zero, C_I is floating, and the voltage V_202 at the second node 202 stays at a first level LV1. At the first time instant 301, CK2 turns high, so does PE, while CK1 and CK3 remain low. I_1 is steered to I_11, causing a discharge of C_I and a linear drop of V_202, all the way to a second level LV2 at the second time instant 302, upon which CK1 and CK3 turn high, CK3B and PE turn low, causing V_202 to have a sudden drop from the second level LV2 to a third level LV3, wherein a difference between LV2 and LV3 is equal to the voltage change of CK3B at the second time instant 302. Now, I_1 is steered to I_10, I_11 is zero, SW1 is turned on, causing a charge sharing of the integration capacitor C_I with the load capacitor C_L. As a result, V_202 is pulled up from LV3 and goes up and approaches a fourth level LV4. At the third time instant 303, CK3 turns low and CK3B turns high, and SW1 is turned off, causing V_202 to have a sudden rise from LV4 to a fifth level LV5, wherein a difference between LV5 and LV1 is equal to the voltage change of CK3B at the third time instant 303. This completes a cycle of time-to-charge conversion, and a total charge transferred to C_L is equal to a total charge provided by I_11, which is equal to the current of I_1 times DT, times a charge-sharing factor that is equal to a capacitance of C_L divided by a sum of a capacitance C_I and the capacitance of C_L. The time-to-charge conversion function is fulfilled, while the charge transfer to the load 240 is synchronous with CK1, which is the reference clock that has stable periodic timing.

Figure 4:
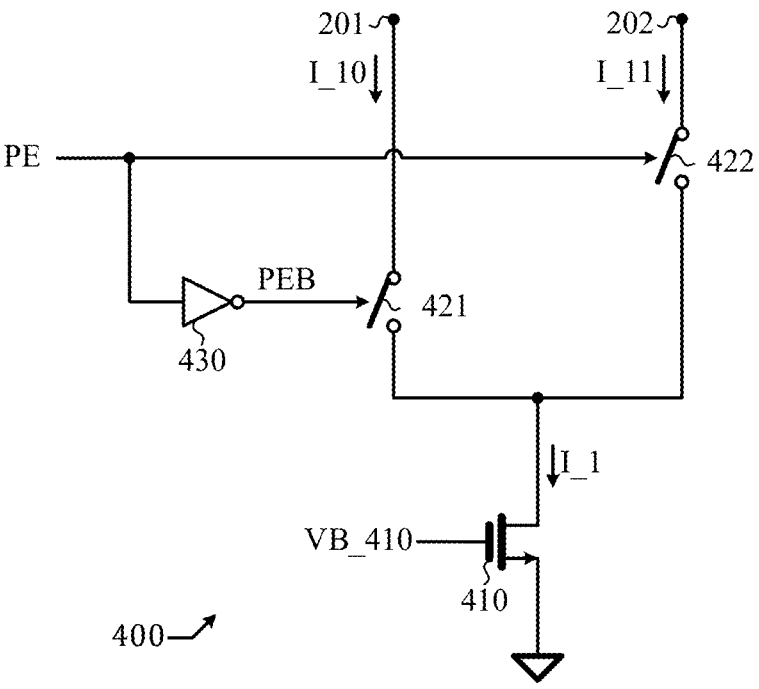
FIG. 4 shows a schematic diagram of a switch-current network that can be used in the time-to-charge converter of FIG. 2.

A switch-current circuit 400, which may be implemented to embody the current source 220 and the current directing network 230, is depicted in FIG. 4. The switch-current circuit 400 comprises: a NMOS transistor 410 configured to embody a current source and establish the tail current I_1 in accordance with a bias voltage VB_410; an inverter 430 configured to receive the phase error signal PE and output an inverted signal PEB; and two switches 421 and 422 controlled by PEB and PE, respectively, and configured to direct the tail current I_1 into the first branch I_10 and the second branch I_11 toward the first node 201 and the second node 202, respectively. The switch-current circuit 400 can be readily understood by those skilled in the art and thus requires no further detailed description herein.

The first node 201 is a low-impedance node to ensure the current directing network 230 exhibits a consistent and well-defined initial condition. In a further embodiment, the TCC 200 comprises a low-impedance active load 280, wherein said low-impedance active load 280 includes a NMOS transistor 281, the source of said NMOS transistor 281 is connected to the first node 201, the gate of said NMOS transistor 281 is connected to a gate bias voltage VG_281, and the drain of said NMOS transistor 281 is connected to a power supply node V_DD. Once NMOS transistor 281 is biased in the saturation region, it can exhibit a low impedance at its source, which is at the first node 201.

In an application wherein the TCC 200 is utilized within a fractional-N PLL (phase-locked loop), the TCC 200 further comprises an offset charge transfer circuit 260 configured to transfer an offset charge to the load 240, wherein the amount of the offset charge is determined by a reference voltage V_REF, in accordance with a timing defined by the third clock CK3 and its inversion CK3B. The offset charge transfer circuit 260 comprises: a PMOS transistor 261 configured as a common-gate amplifier with a gate voltage equal to the reference voltage V_REF; a source capacitor C_S inserted between a power supply node V_DD and a source node 204, which connects to a source of the PMOS transistor 261 through a source switch 262 controlled by CK3; a reset switch 263 inserted between the power supply node V_DD and the source node 204 and controlled by CK3B and configured to reset a charge on the source capacitor C_S. When CK3 is 0 and consequently CK3B is 1, the source node 204 is disconnected from the PMOS transistor 261 and a voltage V_204 thereof is pulled to the power supply node V_DD through the reset switch 263. When CK3 is 1 and consequently CK3B is 0, the source node 204 effectively attaches to the source of the PMOS transistor 261, which conducts a current I_261 to perform a charge transfer from the source capacitor C_S to a capacitive network comprising a parallel connection of the integration capacitor C_I and the load capacitor C_L, causing a voltage V_204 at the source node 204 to fall until a gate-to-source voltage of the PMOS transistor 261 reaches its threshold voltage. The amount of charge transferred to the load capacitor C_L is equal to the change of V_204, which is V_DD−(V_REF+V_TH), times a capacitance of C_S, times a capacitance ratio C_L/(C_L+C_I), where V_TH is a threshold voltage of the PMOS transistor 261.

In a further embodiment, the reference voltage V_REF is generated by a reference voltage generator 270 comprising: a current source 271, a PMOS transistor 273 configured in a diode-connect topology, wherein its gate connects to its drain, which attaches to the current source 271, and its source connects to a power supply node V_DD through a resistor 272. The reference voltage V_REF is tapped at the gate of PMOS transistor 273 and is equal to V_DD minus a voltage drop across the resistors 272 (which is equal to a current of the current source 271 times a resistance of the resistor 272), minus a source-to-gate voltage of PMOS transistor 273, which is slightly larger than a threshold voltage of PMOS transistor 273.

Figure 5:
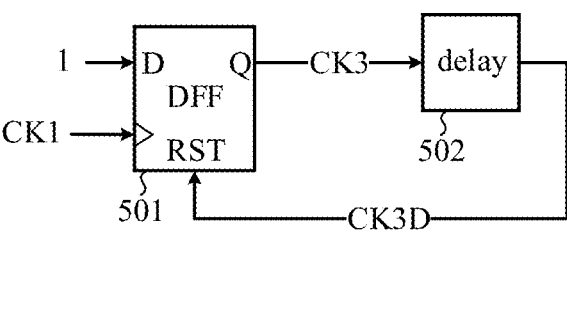
FIG. 5 shows a schematic diagram of a synchronous clock generator that can be used in the time-to-charge converter of FIG. 2.

A schematic diagram of a synchronous clock generator 500 that can be used to embody the synchronous clock generator 290 of FIG. 2 is depicted in FIG. 5. The synchronous clock generator 500 comprises a delay circuit 502 configured to receive CK3 and output a delayed clock CK3D, and a DFF (data flip flop) 501 configured to receive CK1 and output CK3 in accordance with the delayed clock CK3D, which is a delayed version of CK3 with a certain amount of time delay. The DFF 501 has a data input pin "D" that receives a constant 1 input, a data output pin "Q" that outputs CK3, a reset pin "RST" that receives CK3D, and a clock pin denoted by a wedge symbol that receives CK1. Upon a rising edge of CK1, CK3 turns high and exhibits a rising edge, and after said amount of time delay CK3D turns high and prompts DFF 501 to reset and cause CK3 to turn low. As a result, a rising edge of CK1 will trigger a rising edge of CK3 (and therefore CK3 is said to be synchronous to CK1), which has a pulse width determined by the amount of delay of the delay circuit 502 regardless of a pulse width, a thus a duty cycle, of CK1. This way, the TCC 200 can ensure robust functionality regardless of the duty cycle of CK1. Data flip-flops and delay circuits are well known in the prior art and thus are further described herein.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A TCC (time-to-charge converter) comprising:
a phase detector configured to receive a first clock and a second clock and output a phase error signal indicative of a time difference between the second clock and the first clock;
a current source configured to generate a tail current;
a current directing network configured to direct the tail current towards either a first node or a second node based on the phase error signal;
a synchronous clock generator configured to receive the first clock and generate a third clock that is synchronous to the first clock but has an independently determined duty cycle;
an integration capacitor having a top plate connected to the second node and a bottom plate driven by an inversion of the third clock;
a switch positioned between a third node and the second node and controlled by the third clock; and
a load capacitor attached to the third node.

2. The TCC of claim 1, wherein the first clock is a reference clock that has a stable periodic timing.

3. The TCC of claim 2, wherein the first clock is generated by a crystal oscillator.

4. The TCC of claim 1, wherein the phase error signal has a rising edge in response to a rising edge of the second clock and a falling edge in response to a rising edge of the first clock.

5. The TCC of claim 4, wherein the current directing network comprises a second switch controlled by the phase error signal and inserted between a junction node and the second node, and a first switch controlled by an inversion of the phase error signal and inserted between the junction node and the first node, wherein the junction node attaches to the current source.

6. The TCC of claim 1, further comprising a low-impedance active load attached to the first node and comprising a MOS (metal oxide semiconductor) transistor with a source connected to the first node.

7. The TCC of claim 1, further comprising an offset charge transfer circuit comprising: a MOS (metal oxide semiconductor) transistor configured as a common-gate amplifier with a drain attached to the third node, a source connected to a source node through a source switch controlled by the third clock, and a gate controlled by a reference voltage; a source capacitor inserted between a power supply node and the source node; and a reset switch controlled by the inversion of the third clock and inserted between the power supply node and the source node.

8. The TCC of claim 7, further comprising a reference voltage generator comprising: a current source, a MOS transistor configured in a diode-connect topology with a drain connected to a gate and attached to the current source of the reference voltage generator and a source connected to the power supply node through a resistor, wherein the reference voltage is tapped at the gate of the MOS transistors of the reference voltage generator.

9. The TCC of claim 1 further, wherein the synchronous clock generator comprises a delay circuit configured to receive the third clock and output a delayed clock, and a data flip-flop configured to output the third clock in accordance with the first clock and the delayed clock, wherein the first clock serves a trigger function, and the delayed clock serves a reset function.

* * * * *